US012112786B2

(12) United States Patent
La Fratta et al.

(10) Patent No.: US 12,112,786 B2
(45) Date of Patent: Oct. 8, 2024

(54) COMMAND SCHEDULING COMPONENT FOR MEMORY

(71) Applicant: Micron Technology, Inc., Boise, ID (US)

(72) Inventors: Patrick A. La Fratta, McKinney, TX (US); Jeffrey L. Scott, Apex, NC (US); Laurent Isenegger, Morgan Hill, CA (US); Robert M. Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 17/464,516

(22) Filed: Sep. 1, 2021

(65) Prior Publication Data

US 2023/0060826 A1 Mar. 2, 2023

(51) Int. Cl.
*G11C 11/406* (2006.01)
*G06F 13/16* (2006.01)

(52) U.S. Cl.
CPC .... *G11C 11/40603* (2013.01); *G06F 13/1673* (2013.01)

(58) Field of Classification Search
CPC ............. G11C 11/40603; G06F 13/1673
See application file for complete search history.

(56) References Cited

U.S. PATENT DOCUMENTS

| 6,310,814 B1* | 10/2001 | Hampel | G11C 11/406 365/230.03 |
| 2005/0091460 A1* | 4/2005 | Rotithor | G06F 13/1631 711/158 |
| 2006/0004955 A1* | 1/2006 | Ware | G11C 11/406 365/222 |
| 2011/0093665 A1* | 4/2011 | Walker | G11C 8/12 711/E12.001 |

(Continued)

OTHER PUBLICATIONS

Lectures notes 15-740/18-740 Computer Architecture Lecture 20: Main Memory II by Prof Onur Mutlu, etc. published Nov. 5, 2010 available online at https://course.ece.cmu.edu/~ece740/f10/doku.php?id=lectures (Year: 2010).*

(Continued)

*Primary Examiner* — Michael Krofcheck
*Assistant Examiner* — Janice M. Girouard
(74) *Attorney, Agent, or Firm* — Brooks, Cameron & Huebsch, PLLC (57) ABSTRACT

A system includes a processing device that determines whether a memory bank is active and adds an activate command for a row of the memory bank accessed by an oldest command for the memory bank to a command scheduler in response to determining the memory bank is not active. The processing device determines whether the row of the memory bank has a corresponding row command in response to determining the memory bank is active. The processing device determines whether a close page mode is enabled or an open row timer has expired on the row and (Continued)

adds a precharge command to the command scheduler in response to determining the close page mode is enabled or the open row timer has expired. The processing device executes a command in the command scheduler based on a priority of commands included in the command scheduler.

18 Claims, 7 Drawing Sheets

(56) References Cited

U.S. PATENT DOCUMENTS

| | | | |
|---|---|---|---|
| 2015/0026375 A1* | 1/2015 | Takamura | G06F 12/00 710/110 |
| 2015/0049570 A1* | 2/2015 | Lee | G11C 8/08 365/230.03 |
| 2017/0060788 A1* | 3/2017 | Chang | G06F 13/4068 |
| 2019/0121545 A1 | 4/2019 | La Fratta et al. | |
| 2019/0317693 A1 | 10/2019 | La Fratta et al. | |
| 2020/0065027 A1 | 2/2020 | La Fratta et al. | |

OTHER PUBLICATIONS

A book titled Memory Systems, Cache, DRAM, Disk by Bruce Jacob, Spencer W. Ng, etc. Copyright 2008 (Year: 2008).*
Lecture 25: Main Memory by Prof Onur Mutlu available online at https://web.archive.org/web/20150731035306/http://www.ece.cmu.edu/~ece740/f11/lib/exe/fetch.php?media=wiki:lectures:onur-740-fall11-lecture25-mainmemory.pdf (Year: 2015).*
Application entitled, "Credit-Based Scheduling of Memory Commands", U.S. Appl. No. 16/929,003, filed Jul. 14, 2020, Client Matter No. 2019-1650.00/US, 30 pages.
Application entitled, "Command Scheduling in a Memory Subsystem According to a Selected Scheduling Ordering", U.S. Appl. No. 17/323,628, filed May 18, 2021, Client Matter No. 2020-1787.00/US, 32 pages.

* cited by examiner

COMMAND SCHEDULING COMPONENT FOR MEMORY

TECHNICAL FIELD

Embodiments of the present disclosure relates generally to memory sub-systems, and more specifically, relate to a command scheduling component for memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a command scheduling component for memory, in particular to memory sub-systems that include a command scheduling component. A memory sub-system can be a storage system, storage device, a memory module, or a combination of such. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can receive and execute multiple commands. A scheduling policy can be used by the memory sub-system to determine the order in which the commands are executed. For example, a command scheduling component of the memory sub-system can iterate through each outstanding command, consider whether they are executable, assign them priorities, and execute the command with the highest priority.

Iterating through and assigning a priority to every command received by the memory sub-system, however, can decrease the performance of the memory sub-system. The performance of the memory sub-system can decrease because the time and/or processing power that would otherwise be used to perform other functions of the memory sub-system is instead used to iterate through the commands.

Aspects of the present disclosure address the above and other deficiencies by having a memory sub-system that includes a command scheduling component that iterates through less than the full amount of commands received by the memory sub-system to schedule the commands for execution. By iterating through less than the total amount of commands received, the memory sub-system can decrease the amount of time used to iterate through and schedule commands for execution. Iterating through less than the total amount of commands received can also decrease the amount of processing power used to iterate through and assign priority to the commands. The time and processing power saved by iterating less than the total number of commands received by the memory sub-system can be used to perform other functions. This can increase the performance of the memory sub-system.

Figure 1:
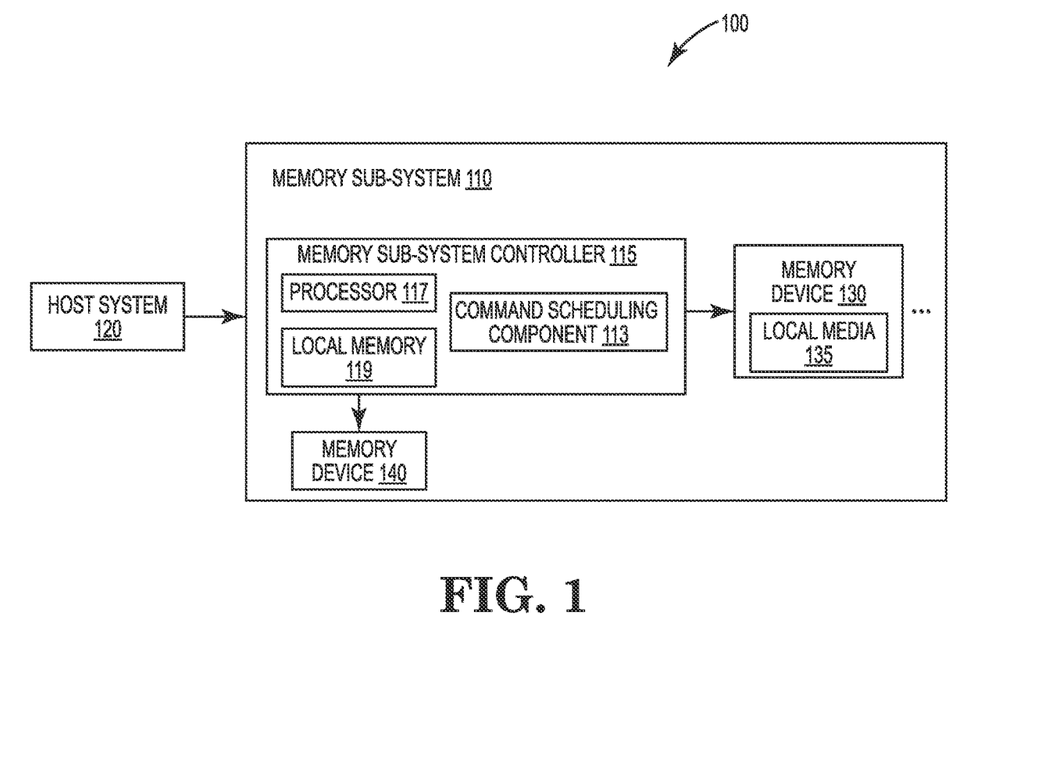
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a Solid-State Drive (SSD), a flash drive, a Universal Serial Bus (USB) flash drive, an Embedded Multi-Media Controller (eMMC) drive, a Universal Flash Storage (UFS) drive, a Secure Digital (SD) card, and a Hard Disk Drive (HDD). Examples of memory modules include a Dual In-line Memory Module (DIMM), a Small Outline DIMM (SO-DIMM), and various types of Non-Volatile Dual In-line Memory Module (NVDIMM).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130 and/or the memory device 140.

In some embodiments, the memory devices 130 include local media controllers 135 that operate in conjunction with memory sub-system controller 115 to execute operations on one or more memory cells of the memory devices 130. An external controller (e.g., memory sub-system controller 115)

can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a command scheduling component 113 that can schedule a number of commands for execution that is less than the total number of commands received by the memory sub-system 110. In some embodiments, the memory sub-system controller 115 includes at least a portion of the command scheduling component 113. For example, the memory sub-system controller 115 can include a processor 117 (processing device) configured to execute instructions stored in local memory 119 for performing the operations described herein. In some embodiments, the command scheduling component 113 is part of the host system 110, an application, or an operating system.

The command scheduling component 113 can place commands received by the memory sub-system 110 in a list for execution based the type of command and the status of the row in which the command will be executed. Once the commands are placed in a list for execution, the command scheduling component 113 can schedule the execution of the commands based on the priority of the commands. The priority of the commands can be determined by multiple factors including, but not limited to, the scheduling policy used in the command scheduling component, the type of the command, and the age of the command. This can allow the command scheduling component 113 to iterate through and assign a priority to the commands that were added to the list for execution instead of every command received by the memory sub-system 110. Further details with regards to the operations of the command scheduling component 113 are described below.

Figure 2:
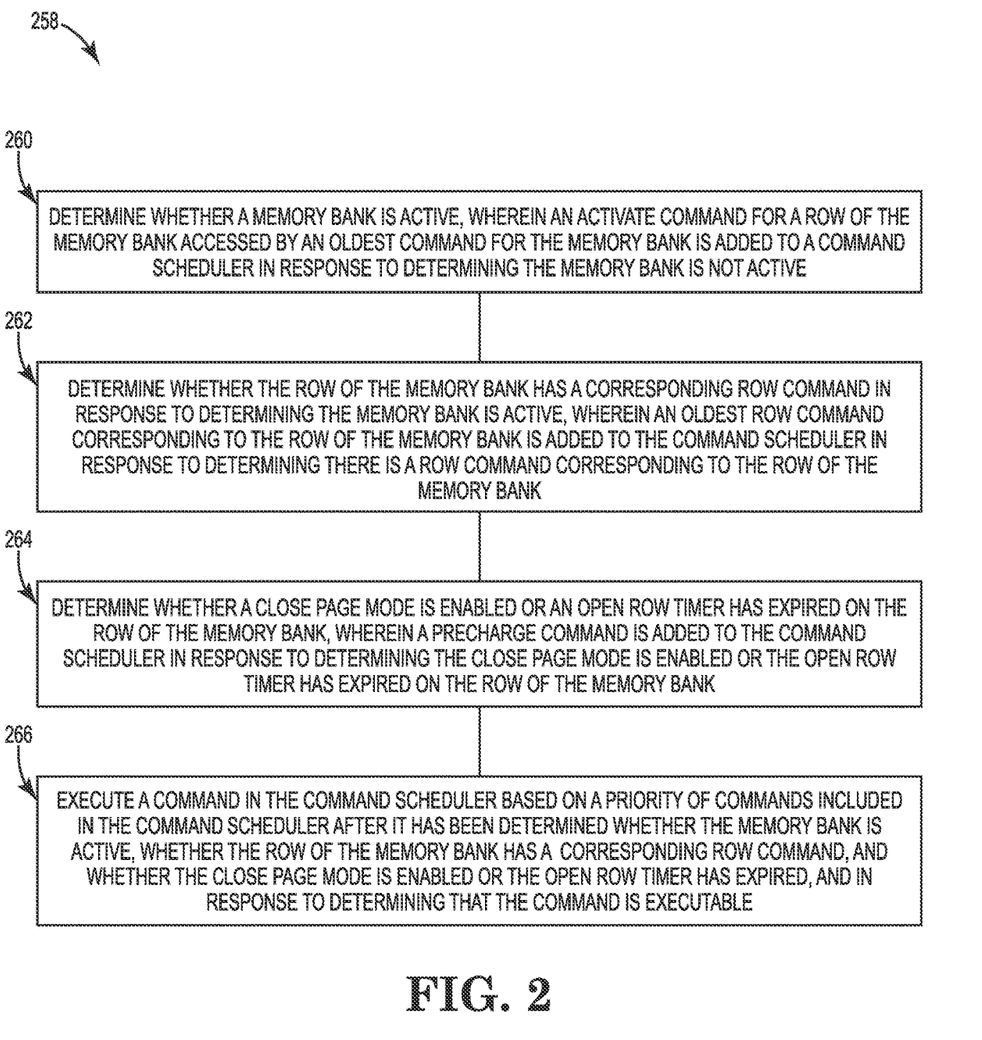
FIG. 2 is a flow diagram of an example method to schedule commands for execution in accordance with some embodiments of the present disclosure.

FIG. 2 is a flow diagram of an example method 258 to schedule commands for execution in accordance with some embodiments of the present disclosure. The method 258 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 258 is performed by the command scheduling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 260, the processing device can determine whether a memory bank is active, and an activate command for a row of the memory bank accessed by the oldest command for the memory bank can be added to a command scheduler in response to determining the memory bank is not active. A column command can be added to a command list after the command scheduler receives the column command. The memory bank can be, for example, one of a plurality of memory banks included in memory device 130.

At operation 262, the processing device can determine whether the row of the memory bank has a corresponding row command in response to determining the memory bank is active, and the oldest row command corresponding to the row of the memory bank can be added to the command scheduler in response to determining there is a row command corresponding to the row of the memory bank. The row command can be added to the command queue after the command scheduler receives the row command.

At operation 264, the processing device can determine whether a close page mode is enabled or an open row timer has expired on the row of the memory bank, and a precharge command can be added to the command scheduler in response to determining the close page mode is enabled or the open row timer has expired on the row of the memory bank. The precharge command can be added to the command queue after the activate command is added to the command scheduler.

At operation 266, the processing device can execute a command in the command scheduler based on a priority of commands included in the command scheduler after it has been determined whether the memory bank is active, whether the row of the memory bank has a corresponding row command, and whether the close page mode is enabled or the open row timer has expired, and in response to determining that the command is executable. In some embodiments, a scheduling candidate list can be formed in the command scheduler. The scheduling candidate list can include the commands that were added to the command scheduler.

The processing device can execute the commands in the scheduling candidate list based on a priority of commands. Establishing the priority of commands can include prioritizing execution of the oldest column command in the scheduling candidate list over execution of another column command in the scheduling candidate list. Establishing the priority of commands can also include prioritizing execution of a column command in the scheduling candidate list over execution of an activate command in the scheduling candidate list. Further, establishing the priority of commands can include prioritizing execution of an activate command in the scheduling candidate list over execution of a precharge command in the scheduling candidate list.

Figure 3:
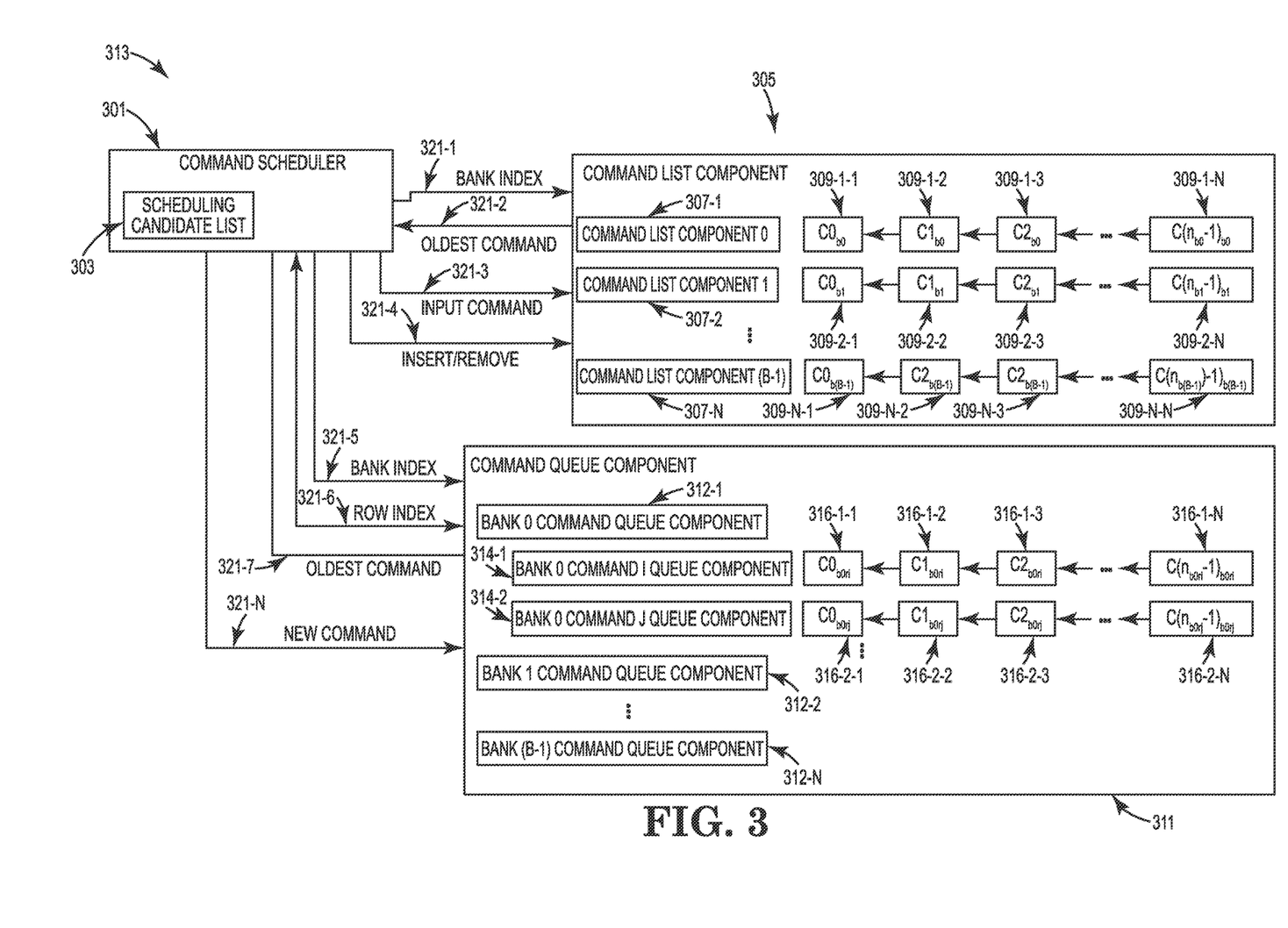
FIG. 3 is a block diagram of an example command scheduling component in accordance with a number of embodiments of the present disclosure.

FIG. 3 is a block diagram of an example command scheduling component 313 in accordance with a number of embodiments of the present disclosure. Command scheduling component 313 can be, for instance, command scheduling component 113 previously described in connection with FIG. 1. The command scheduling component 313 includes a command scheduler 301, a scheduling candidate list 303, a command list component 305 and a command queue component 311. The command scheduling component 313 can also include multiple input/output (I/O) lines 321-1, 321-2, . . . , 321-N (individually or collectively referred to as I/O lines 321) to transfer data between command scheduler 301 and command list component 305, and to transfer data between command scheduler 301 and command queue component 311.

When the memory sub-system (e.g., memory sub-system 110 in FIG. 1) receives a command, the command scheduling component 313 can determine whether to add the command to the scheduling candidate list 303. As will be further described in FIG. 4 and FIG. 6, the commands that will be added to the scheduling candidate list can be determined by the scheduling policy of the command scheduling component 313. For instance, command scheduling component 313 can add an activate command, an oldest row command, and a precharge command to a command list and a command queue after the commands are added to the command scheduler 301.

The command list component 305 can include multiple command lists 307-1, 307-2, . . . , 307-N (individually or collectively referred to as command lists 307). For instance, the command list component 305 can include one command list for each memory bank. As used herein, the term "memory bank" can refer to a portion (e.g., a subset) of a memory component in which information (e.g., data) is stored. In some embodiments, each command list 307 can include multiple commands 309-1-1, . . . , 309-1-N, 309-2-1, . . . , 309-2-N, 309-N-1, . . . , 309-N-N (individually or collectively referred to as commands 309). Entries to the command list component 305 can be inserted at the back of the command list command 305. Entries to the command list component 305 can be removed in any order.

The command queue component 311 can include multiple command queues 312-1, 312-2, . . . , 312-N (individually or collectively referred to as command queue 312). The command queue component 311 can include one command queue 314 for each row of a memory bank with at least one outstanding command 316-1-1, . . . , 316-1-N, 316-2-1, . . . , 316-2-N (individually or collectively referred to as commands 316). In some embodiments, each command queue 314 can include multiple commands 316. Entries to the command queue component 311 can be removed in the order of their entrance into the command queue 314. In some embodiments, the command queue 314 can be sorted by an age of the row commands 316 included in the command queue 312. Command scheduling component 313 can determine the age of the row command 316 based on a column command that will execute after the row command 316 is executed.

Figure 4:
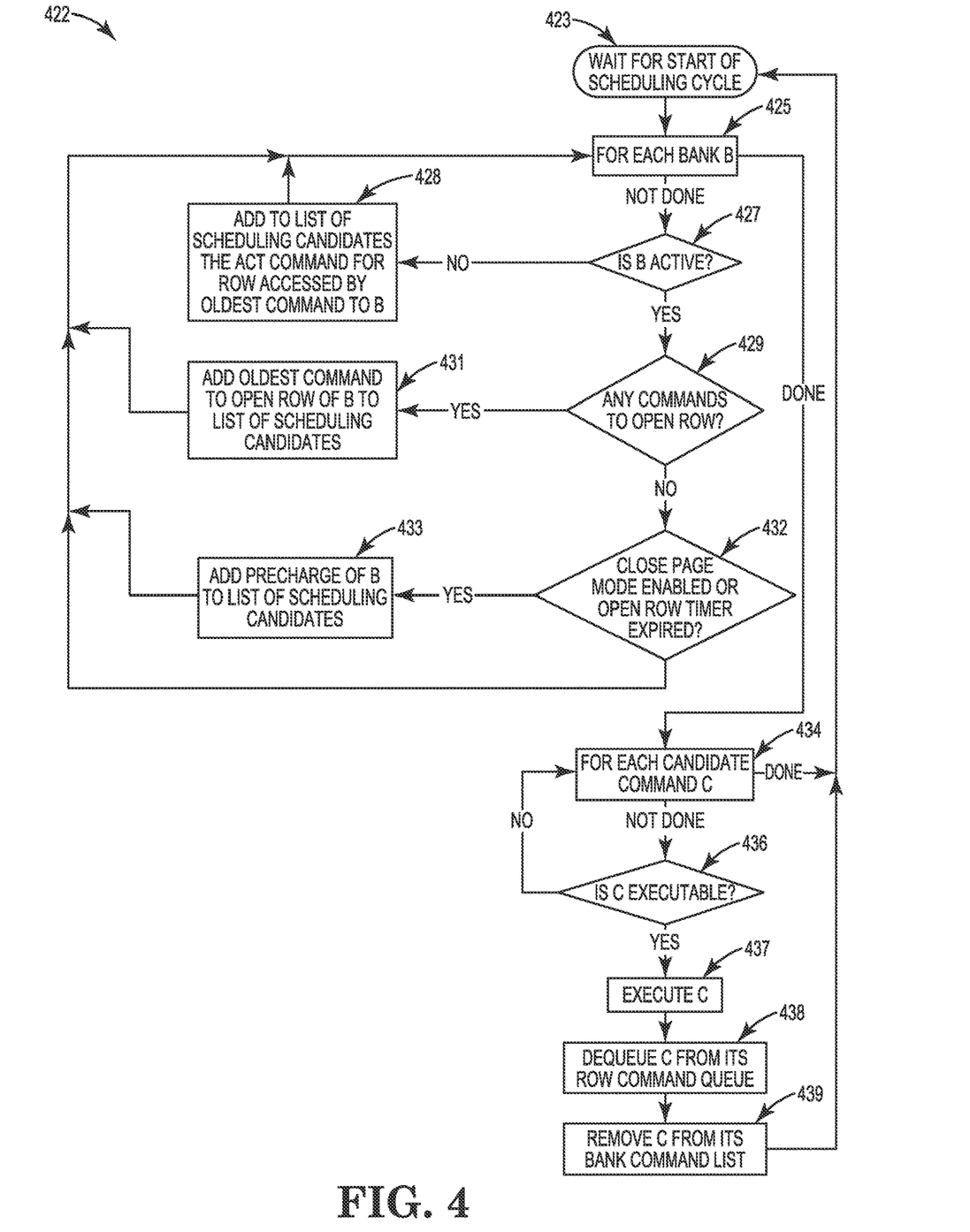
FIG. 4 is a flow diagram of an example method to schedule commands for execution in accordance with some embodiments of the present disclosure.

FIG. 4 is a flow diagram of an example method 422 to schedule commands for execution in accordance with some embodiments of the present disclosure. The method 422 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 422 is performed by the command scheduling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 423, the processing device can wait for the start of a scheduling cycle. As used herein, the term "scheduling cycle" refers to the process of scheduling at least one command for execution. The process of scheduling a command for execution can follow a scheduling policy. In some embodiments, the command scheduler can be a first ready first come first serve (FR-FCFS) command scheduler (e.g., command scheduler 303 in FIG. 3) that follows a FR-FCFS scheduling policy. The FR-FCFS scheduling policy can be an algorithm that executes commands that are ready for execution in the order that they are received. For example, a command scheduler that is scheduling commands for execution based on an FR-FCFS scheduling policy will execute the first command the command scheduler receives that is ready for execution before executing any subsequently received commands that are ready for execution.

At operation 425, the processing device can examine each memory bank in a portion of a memory device (e.g., memory device 130 in FIG. 1). At operation 427, the processing device can determine whether a memory bank of the plurality of memory banks of the memory device is active. As used herein, the term "active memory bank" refers to a memory bank that is being accessed by a command.

At operation 428, the processing device can add an activate command for a row of the memory bank accessed by the oldest command for the memory bank to the scheduling candidate list in the command scheduler in response to determining the memory bank is not active. An activate command can open the row of the memory bank and allow the row of the memory bank to be accessed by subsequent commands. In some embodiments, the activate command for the row of the memory bank that is added to the command scheduler can be the activate command for the row of the memory bank accessed by the oldest command for the memory bank. The row of the memory bank will remain open until a precharge command is executed on that row. Once the activate command has been added to the scheduling candidate list, the processing device can once again examine each memory bank in a portion of the memory device to determine whether a memory bank is active, as described in reference to operations 425 and 427.

At operation 429, the processing device can determine whether the row of the memory bank has a corresponding row command in response to determining the memory bank is active. Row commands can include activate commands and precharge commands. An activate command can open a row and a precharge command can close a row.

At operation 431, the processing device can add the oldest row command corresponding to the row of the memory bank to the scheduling candidate list of the command scheduler in response to determining there is a row command corresponding to the row of the memory bank. In some embodiments, the oldest row command corresponding to the row of the memory bank can be determined by determining which row command is the first row command in the command list (e.g., command list 305 in FIG. 3). In some embodiments, the oldest command corresponding to the row in the memory bank can be determined based on a time stamp indicating which command entered the command queue (e.g., command queue 311 in FIG. 3) first. After adding the oldest row command corresponding to the row of the memory bank to the scheduling candidate list, the processing device can once again examine each memory bank in a portion of the memory device to determine whether a memory bank is active, as described in reference to operations 425 and 427.

At operation 432, the processing device can determine whether a close page mode is enabled or an open row timer has expired on the row of the memory bank in response to determining there is no row command corresponding to the row of the memory bank. As used herein, the term "close page mode" refers to a mode of managing memory banks in which any open row of the memory bank is precharged immediately after an access to the row. As used herein, the term "open row timer" refers to a mechanism in which a timer counts down with every clock tick of a clock cycle, and when the open row timer expires (e.g., when the open row timer reaches zero), a precharge command is issued for the open row. In response to determining the close page mode is not enabled and the open row timer has not expired, the processing device can once again examine each memory bank in a portion of the memory device to determine whether a memory bank is active, as described in reference to operations 425 and 427.

At operation 433, the processing device can add a precharge command to the command scheduler in response to determining the close page mode is enabled or the open row timer has expired on the row of the memory bank. After the precharge command is added to the command scheduler, the processing device can once again examine each memory bank in a portion of the memory device to determine whether a memory bank is active, as described in reference to operations 425 and 427.

At operation 434, the processing device can examine each command that was added to the scheduling candidate list in the command scheduler. At operation 436, the processing device can determine whether a command in the command scheduler can be executed. If the processing device determines that the command cannot be executed, the processing device will examine the next command in the command scheduler to determine whether a command can be executed, until all commands in the command scheduler have been examined.

At operation 437, the processing device can execute a command in the command scheduler based on a priority of commands included in the command scheduler after it has been determined whether the memory bank is active, whether the row of the memory bank has a corresponding row command, and whether the close page mode is enabled or the open row timer has expired, and in response to determining that the command is executable. At operation 438, the processing device can dequeue the command from the command queue after the command has been executed. At operation 439, the processing device can remove the command from the command list after the command has been executed.

Figure 5:
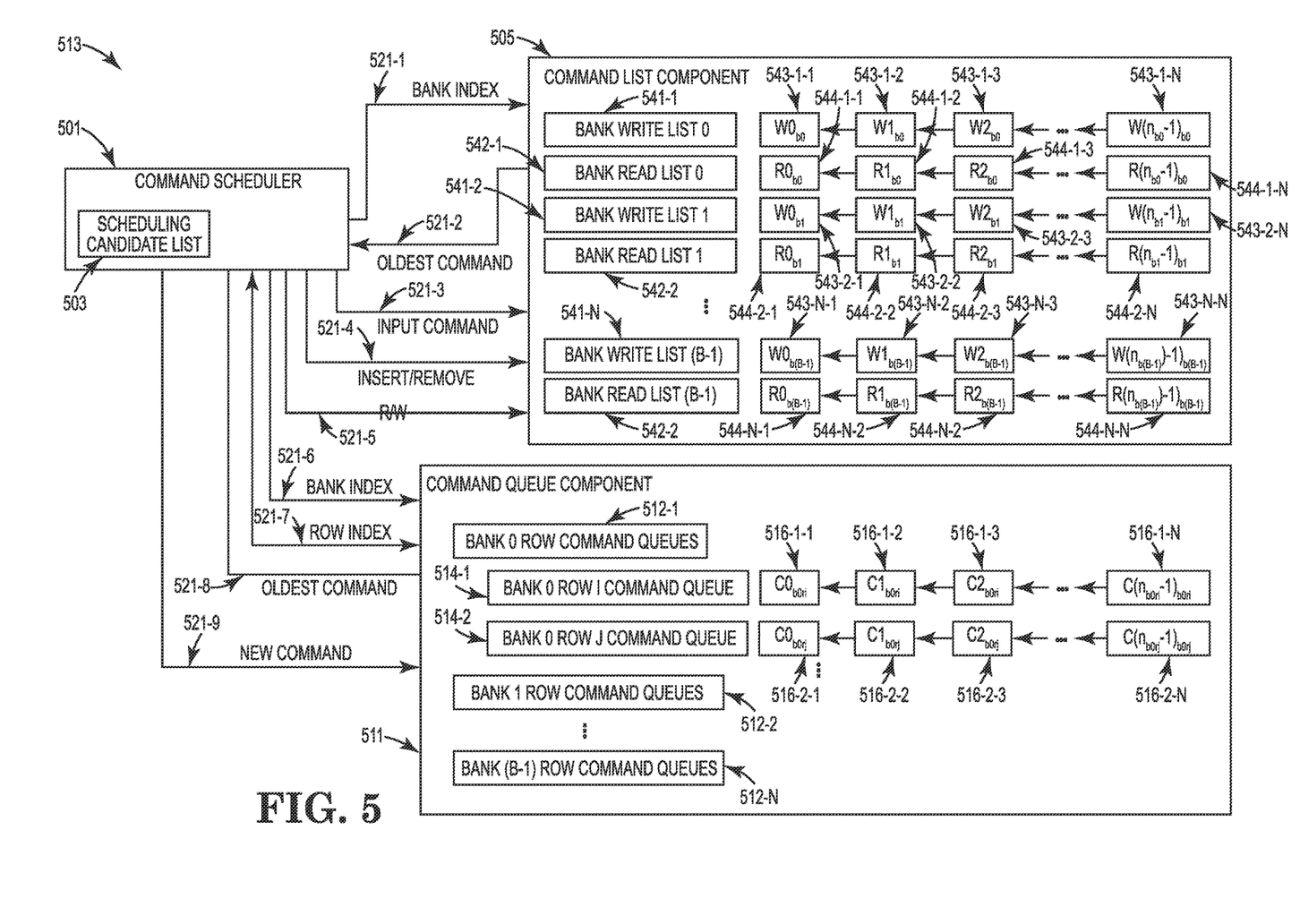
FIG. 5 illustrates a block diagram of an example command scheduling component in accordance with a number of embodiments of the present disclosure.

FIG. 5 illustrates a block diagram of an example command scheduling component in accordance with a number of embodiments of the present disclosure. Components of the command scheduling component 513 can be analogous to those of command scheduling component 313 in FIG. 3. For example, the command scheduler 501, scheduling candidate list 503, command list component 505, command queue component 511 and I/O lines 512, can be analogous to the command scheduler 301, the candidate scheduling list 303, command list component 305, command queue component 311, and I/O lines 312, respectively, in FIG. 3.

The command scheduling component 513 can schedule commands for execution based on an FR-FCFS policy that prioritizes executing read commands over executing write commands. For example, in contrast to the command list component 305 in FIG. 3, the command list component 505 can include write command lists 541-1, 541-2, . . . , 541-N (individually or collectively referred to as write command lists 541) and read command lists 542-1, 542-2, . . . , 542-N (individually or collectively referred to as read command lists 542). The write command lists 541 can include write commands 543-1-1, . . . , 543-1-N, 543-2-1, . . . , 543-2-N, 543-N-1, . . . , 543-N-N (individually or collectively referred to as write commands 543). The read command lists 542 can include read commands 544-1-1, . . . , 544-1-N, 544-2-1, . . . , 544-2-N, 544-N-1, . . . , 544-N-N (individually or collectively referred to as read commands 544).

The command list component 505 can include separate write command lists 541 and read command lists 542 because, in this embodiment, the command scheduler 501 prioritizes executing read commands 544 over executing write commands 543. Separating read commands and write commands can allow the command scheduler to select commands from a list that only includes read commands when determining which command to execute. The command queue component 511 can include command queues 512 and row commands 516, which are analogous to command queues 312 and row commands 316 in FIG. 3.

The command scheduling component 513 can schedule components for execution in multiple types of memory devices (e.g., memory device 130 in FIG. 1). For example, in some embodiments, the command scheduling component 513 can schedule components for execution in a memory device that does not require row commands 516 (e.g., an activate command and a precharge command). In this embodiment, the oldest read command 544 and the oldest write command 543 can each be a candidate for execution.

In these embodiments, the read priority of the FRFCFS command scheduler 501 can be disabled. Further, an I/O line (e.g., I/O line 521) coupling the command scheduler 501 to the command list component 505 can be added to the command scheduling component 513 to transfer the oldest command with no parent dependence from the command scheduler 501 to the command list component 505. As used herein, the term "command with no parent dependence" refers to the first command in a read command list 542 and/or the first command in a write command list 541. The command scheduler 501 can add each command with no parent dependence to the scheduling candidate list 503.

Further, in these embodiments, the read priority of the FRFCFS command scheduler 501 can be enabled. When the read priority of the FRFCFS command scheduler is enabled, if the oldest read command 544 of the memory bank is not the oldest read command 544 of the row of the memory bank, the oldest read command 544 of that row of the memory bank, instead of the oldest read command 544 of the memory bank, can be added to the scheduling candidate list 503.

Figure 6:
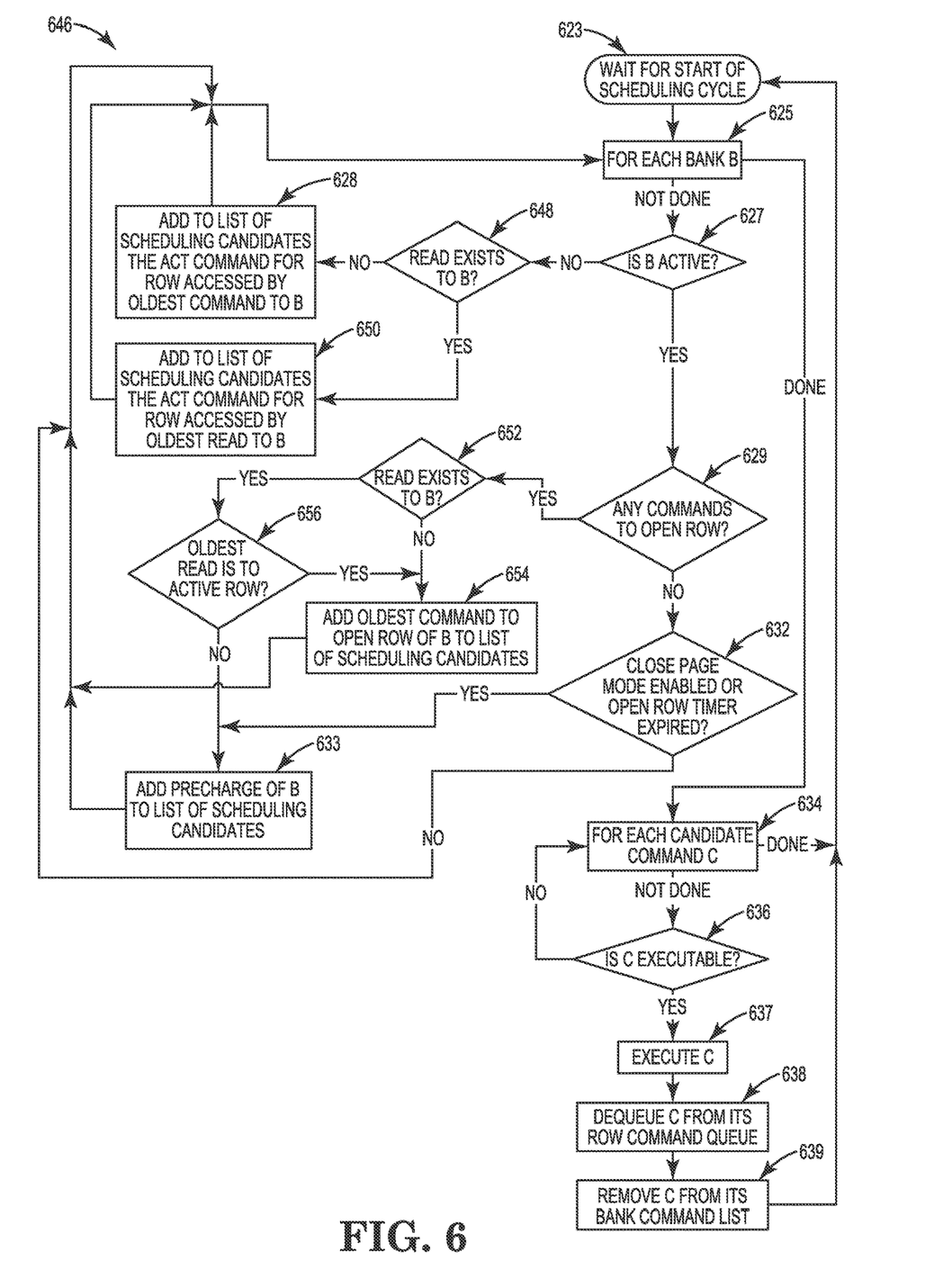
FIG. 6 is a flow diagram of an example method to schedule commands for execution in accordance with some embodiments of the present disclosure.

FIG. 6 is a flow diagram of an example method 646 to schedule commands for execution in accordance with some embodiments of the present disclosure. The method 646 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 646 is performed by the command scheduling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 623, the processing device can wait for the start of a scheduling cycle. In some embodiments, the command scheduling component that executes the scheduling cycle can prioritize the execution of read commands over the execution of write commands. Prioritizing the execution of read commands over the execution of write commands can cause the command scheduling component to search for read commands corresponding to a row of a memory bank to add to the command scheduler before searching for write commands corresponding to a row of a memory bank to add to the command scheduler.

At operation 625, the processing device can examine each memory bank in a portion of a memory device (e.g., memory device 130 in FIG. 1). In some embodiments, each memory bank can be examined sequentially. In some embodiments, multiple memory banks can be examined in parallel. At operation 627, the processing device can determine whether a memory bank of the plurality of memory banks of the memory device is active.

At operation 648, the processing device can determine whether the memory bank has a corresponding read command (e.g., a read command to be executed on the memory bank) in response to determining the memory bank is not active. In an FR-FCFS policy that prioritizes read commands, the determination of whether there is a read command corresponding to the memory bank determines which command is added to the command scheduler.

At operation 628, the processing device can add the activate command for the row of the memory bank that is accessed by the oldest write command to the command scheduler in response to determining the memory bank does not have a corresponding read command in response to determining the memory bank is not active. At operation 650, the processing device can add the activate command for the row of the memory bank that is accessed by the oldest read command to the command scheduler in response to determining the memory bank has a corresponding read command in response to determining that the memory bank is not active. After the activate command for the row of the memory bank that is accessed by either the oldest read command or the oldest write is added to the command scheduler, the processing device can once again examine each memory bank in the portion of the memory device to determine whether a memory bank is active, as described in reference to operations 625 and 627.

At operation 629, the processing device can determine whether a row of the memory bank has a corresponding row command (e.g., a command to be executed on that row) in response to determining the memory bank is active. At operation 652, the processing device can determine whether the active memory bank has a corresponding read command in response to determining the active memory bank has a corresponding row command. The determination of whether the active memory bank has a corresponding read command can determine which command is added to the command scheduler.

At operation 654, the processing device can add the oldest row command for the row of the active memory bank to the command scheduler in response to determining the active memory bank does not have a corresponding read command. After the oldest row command for the row of the active memory bank is added to the command scheduler, the processing device can once again examine each memory bank in the portion of the memory device to determine whether a memory bank is active, as described in reference to operations 625 and 627.

At operation 656, the processing device can determine whether the oldest read command corresponds to an active row of the active memory bank in response to determining the active memory bank has a corresponding read command. The processing device can add the oldest row command for the row of the active memory bank to the command scheduler at operation 654 in response to determining the oldest read command corresponds to the active row of the active memory bank. At operation 633, the processing device can add a precharge command to the command scheduler in response to determining the oldest read command does not correspond to the active row of the active memory bank. After the oldest row command for the row of the active memory bank or the precharge command is added to the command scheduler, the processing device can once again examine each memory bank in the portion of the memory device to determine whether a memory bank is active, as described in reference to operations 625 and 627.

At operation 632, the processing device can determine whether a close page mode is enabled on the row of the active memory bank or an open row timer has expired on the row of the active memory bank in response to determining the active memory bank does not have a corresponding row command at operation 629. The processing device can once again examine each memory bank in the portion of the memory device to determine whether a memory bank is active, as described in reference to operations 625 and 627, in response to determining the close page mode is not enabled or the active row timer has not expired. The processing device can add a precharge command to the command scheduler, as described at operation 633, in response to determining the close page mode is enabled on the row of the active memory bank or the open row timer has expired on the row of the active memory bank. The processing device can once again examine each memory bank in the portion of the memory device to determine whether a memory bank is active, as described in reference to operations 625 and 627, in response to adding the precharge command to the command scheduler.

At operation 634, the processing device can examine each command in the command scheduler. At operation 636, the processing device can determine whether a command in the command scheduler can be executed. If the processing device determines that the command cannot be executed, the processing device will examine the next command in the command scheduler to determine whether a command in the command scheduler can be executed, until all commands in the command scheduler have been examined.

At operation 637, the processing device can execute a row command based on a priority of commands in response to determining the row command is executable. In some embodiments, a read command can be prioritized for execution over a write command in the priority of commands. However, if both a read and a write command access the same row and the write command arrived before the read command, the FR-FCFS read priority can raise the priority of the write command since the execution of the read command can be blocked by the execution of the write command. Further, a high priority column command can be prioritized for execution over a high priority activate command in the priority of commands. As used herein, the term "high priority command" refers to either a read command or a command that activates a row that has a corresponding read command so that the read command can be executed. Further, a high priority activate command can be prioritized for execution over a low priority write column command in the priority of commands. As used herein, the term "low priority command" refers to a command that is neither a read command nor a command that activates a row that has a corresponding read command so that the read command can be executed. In some embodiments, a low priority write column command can be prioritized for execution over a low priority write activate command in the priority of commands. Further, a low priority write activate command can be prioritized for execution over the precharge command in the priority of commands. In some embodiments, commands can be prioritized in the priority of commands based on a quantity of accesses to corresponding memory banks.

At operation 638, the processing device can dequeue the command from the command queue after the command has been executed. At operation 639, the processing device can remove the command from the command list after the command has been executed.

Figure 7:
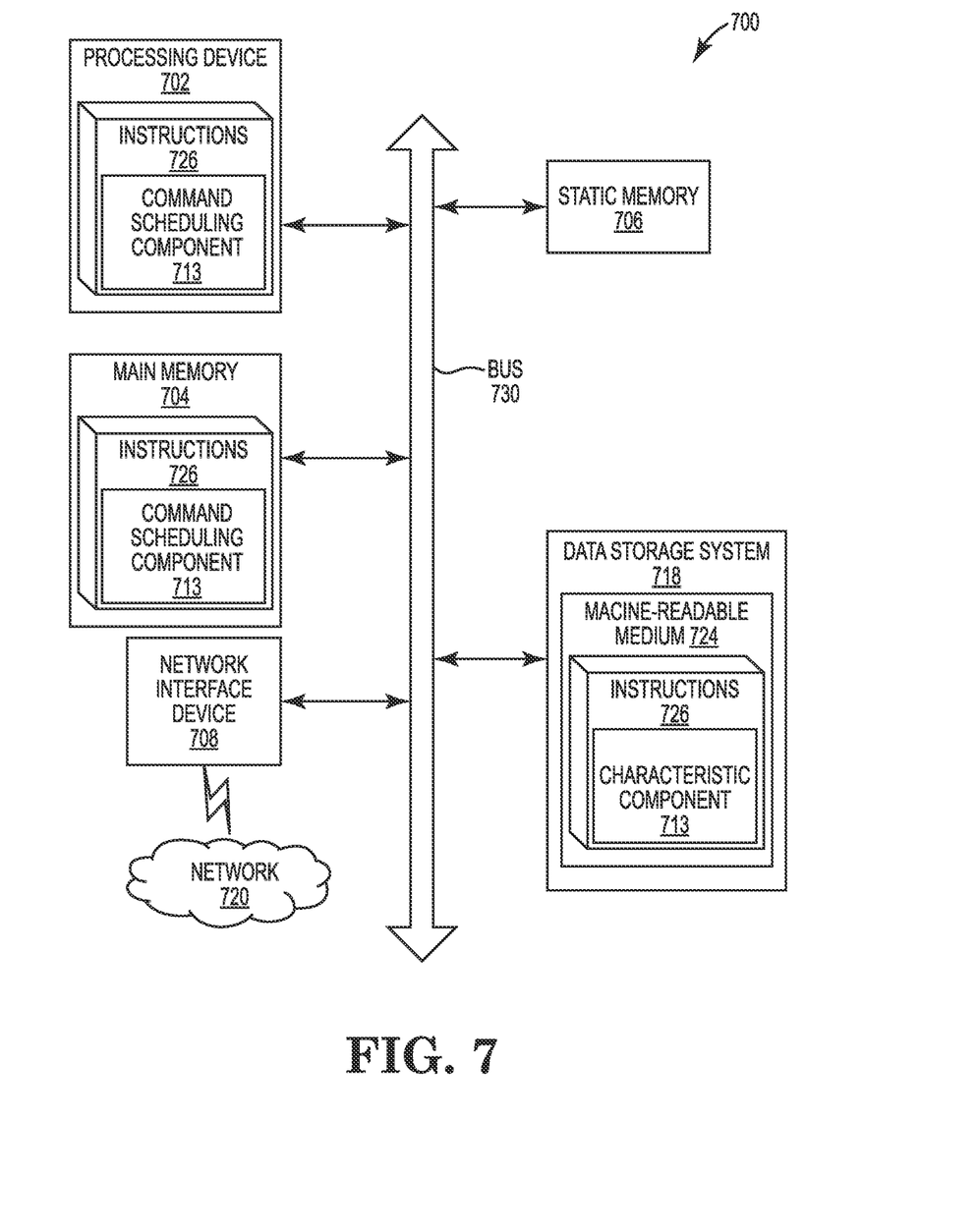
FIG. 7 is a block diagram of an example computer system in which embodiments of the present disclosure may operate.

FIG. 7 is a block diagram of an example computer system 700 in which embodiments of the present disclosure may operate. For example, FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the command scheduling component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a command scheduling component (e.g., the command scheduling component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The figures herein follow a numbering convention in which the first digit or digits correspond to the figure number and the remaining digits identify an element or component in the figure. Similar elements or components between different figures may be identified by the use of similar digits. For example, 113 may reference element "13" in FIG. 1, and a similar element may be referenced as 313 in FIG. 3. A group or plurality of similar elements or components may generally be referred to herein with a single element number. For example, a plurality of reference elements 307-1 to 307-N may be referred to generally as 307. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a memory component having a plurality of memory banks; and
a processing device, operatively coupled with the memory component, to:
make a first determination of whether at least one memory bank of the plurality of memory banks is active, wherein an activate command for a row of the at least one memory bank accessed by an oldest command for the at least one memory bank is added to a command scheduler in response to determining the at least one memory bank is not active;
in response to the activate command being added to the command scheduler, make a second determination of whether the at least one memory bank is active, wherein the second determination is made immediately after the activate command is added to the command scheduler with no scheduling actions occurring between the activate command being added to the command scheduler and the second determination being made;
in response to the second determination of whether the at least one memory bank is active coming to a determination that the at least one memory bank is active, determine whether the row of the at least one memory bank has a corresponding row command, wherein the oldest row command corresponding to the row of the at least one memory bank is added to the command scheduler in response to determining the at least one memory bank is active and determining there is a row command corresponding to the row of the at least one memory bank;
in response to the oldest row command corresponding to the row of the at least one memory bank being added to the command scheduler, make a third determination of whether the at least one memory bank is active, wherein:
the third determination is made immediately after the oldest row command corresponding to the row of the at least one memory bank is added to the command scheduler with no scheduling actions occurring between the oldest row command corresponding to the row of the at least one memory bank being added to the command scheduler and the third determination being made; and
a precharge command is added to the command scheduler in response to determining the at least one memory bank is active, determining the at least one memory bank does not have a row command corresponding to the row of the at least one memory bank, and determining either a close page mode is enabled or an open row timer has expired on the row of the at least one memory bank;
in response to the precharge command being added to the command scheduler, determine whether any commands in the command scheduler are executable; and execute a command in the command scheduler based on a priority of commands included in the command scheduler in response to determining the at least one memory bank is active, the row of the at least one memory bank does not have a corresponding row command, either the close page mode is enabled or the open row timer has expired, and the command is executable.

2. The system of claim 1, wherein the processing device is to add the activate command, the oldest row command, and the precharge command to a command list and a command queue after the commands are added to the command scheduler.

3. The system of claim 2, wherein the command queue is sorted by an age of row commands included in the command queue.

4. The system of claim 2, wherein the processing device is to dequeue the command from the command queue after the command has been executed.

5. The system of claim 2, wherein the processing device is to remove the command from the command list after the command has been executed.

6. The system of claim 1, wherein the processing device is to determine an age of the row command based on a column command that will execute after the row command is executed.

7. The system of claim 1, wherein the command scheduler is a first ready first come first serve (FR-FCFS) command scheduler.

8. A method, comprising:
making a first determination of whether at least one memory bank of a plurality of memory banks is active, wherein an activate command for a row of the at least one memory bank accessed by an oldest command for the at least one memory bank is added to a command scheduler in response to determining the at least one memory bank is not active;
in response to the activate command being added to the command scheduler, making a second determination of whether the at least one memory bank is active; wherein the second determination is made immediately after the activate command is added to the command scheduler with no scheduling actions occurring between the activate command being added to the command scheduler and the second determination being made;
in response to the second determination of whether the at least one memory bank is active coming to a determination that the at least one memory bank is active, determining whether the row of the at least one memory bank has a corresponding row command, wherein an oldest row command corresponding to the row of the at least one memory bank is added to the command scheduler in response to determining the at least one memory bank is active and determining there is a row command corresponding to the row of the at least one memory bank;
in response to the oldest row command corresponding to the row of the at least one memory bank being added to the command scheduler, making a third determination of whether the at least one memory bank is active, wherein:
the third determination is made immediately after the oldest row command corresponding to the row of the at least one memory bank is added to the command scheduler with no scheduling actions occurring between the oldest row command corresponding to the row of the at least one memory bank being added to the command scheduler and the third determination being made; and
a precharge command for the at least one memory bank is added to the command scheduler in response to determining the at least one memory bank is active, determining the at least one memory bank does not have a row command corresponding to the row of the at least one memory bank, and determining either a close page mode is enabled or an open row timer has expired on the row of the at least one memory bank; and
executing a command in the command scheduler based on a priority of commands included in the command scheduler in response to determining the at least one memory bank is active, the row of the at least one memory bank does not have a corresponding row command, either the close page mode is enabled or the open row timer has expired, and the command is executable.

9. The method of claim 8, further comprising forming a scheduling candidate list in the command scheduler, wherein the scheduling candidate list comprises commands added to the command scheduler.

10. The method of claim 9, further comprising:
prioritizing execution of an oldest column command in the scheduling candidate list over execution of another column command in the scheduling candidate list;
prioritizing execution of a column command in the scheduling candidate list over execution of the activate command in the scheduling candidate list; and
prioritizing execution of the activate command in the scheduling candidate list over execution of the precharge command in the scheduling candidate list.

11. The method of claim 8, further comprising:
adding a column command to a command list after the command scheduler receives the column command; and
adding the row command to a command queue after the command scheduler receives the row command.

12. The method of claim 11, wherein the oldest row command corresponding to the row of the at least one memory bank is determined by determining which row command is a first row command in the command list.

13. The method of claim 11, wherein the oldest command corresponding to the row in the at least one memory bank is determined based on a time stamp indicating which command entered the command queue first.

14. The method of claim 8, wherein the activate command for the row of the at least one memory bank that is added to the command scheduler is an activate command for the row of the at least one memory bank accessed by an oldest command for the at least one memory bank.

15. A non-transitory computer-readable storage medium comprising instructions that, when executed by a processing device, cause the processing device to:
make a first determination of whether at least one memory bank of a plurality of memory banks is active;
in response to the first determination determining that the at least one memory of the plurality of memory banks is not active, determine whether the at least one memory bank has a corresponding read command, wherein:
a first activate command for a row of the at least one memory bank that is accessed by an oldest write command is added to a command scheduler in response to determining that the at least one memory bank does not have the corresponding read command, as well as determining the at least one memory bank is not active; and a second activate command for the row of the at least one memory bank that is accessed by an oldest read command is added to the command scheduler in response to determining that the at least one memory bank has the corresponding read command, as well as determining the at least one memory bank is not active;

in response to either the first activate command or the second activate command being added to the command scheduler, make a second determination of whether the at least one memory bank is active, wherein the second determination is made immediately after either the first activate command or the second activate command is added to the command scheduler with no scheduling actions occurring between either the first activate command or the second activate command being added to the command scheduler and the second determination being made;

in response to the second determination of whether the at least one memory bank is active making a determination that the at least one memory bank is active, determine whether a row of the at least one memory bank has a corresponding row command, wherein the corresponding row command is the first activate command, the second activate command, or a precharge command;

in response to determining the at least one active memory bank has the corresponding row command, determine whether the at least one active memory bank has a corresponding read command, wherein:

the oldest row command for the row of the at least one active memory bank is added to the command scheduler in response to determining the at least one active memory bank does not have the corresponding read command; and a determination is made whether the oldest read command for the row of the at least one active memory bank corresponds to an active row of the at least one active memory bank in response to determining the at least one active memory bank has the corresponding read command, wherein:

the oldest row command for the row of the at least one active memory bank is added to the command scheduler in response to determining the oldest read command corresponds to the active row of the at least one active memory bank; and a first precharge command is added to the command scheduler in response to determining the oldest read command does not correspond to the active row of the at least one active memory bank;

in response to either the oldest row command for the row of the at least one active memory bank being added to the command scheduler or the first precharge command being added to the command scheduler, make a third determination of whether the memory bank is active, wherein the third determination is made immediately after either the oldest row command for the row of the at least one active memory bank or the first precharge command is added to the command scheduler with no scheduling actions occurring between the oldest row command for the at least one memory bank or the first precharge command being added to the command scheduler and the third determination being made;

in response to the third determination of whether the at least one memory bank is active coming to the determination that the at least one memory bank is active and the row of the at least one active memory bank does not have a row command, determine whether either a close page mode is enabled on the row of the at least one active memory bank or an open row timer has expired on the row of the at least one active memory bank, wherein a second precharge command is added to the command scheduler in response to determining either the close page mode is enabled on the row of the at least one active memory bank or the open row timer has expired on the row of the at least one active memory bank;

in response to the second precharge command being added to the command scheduler, determine whether any commands in the command scheduler can be executed; and in response to determining the command scheduler includes at least one executable row command, execute the row command based on a priority of commands.

16. The non-transitory computer-readable storage medium of claim 15, wherein a read command is prioritized for execution over a write command in the priority of commands.

17. The non-transitory computer-readable storage medium of claim 15, wherein:

a high priority column command is prioritized for execution over a high priority activate command in the priority of commands;

a high priority activate command is prioritized for execution over a low priority write column command in the priority of commands;

a low priority write column command is prioritized for execution over a low priority write activate command in the priority of commands; and a low priority write activate command is prioritized for execution over the precharge command in the priority of commands.

18. The non-transitory computer-readable storage medium of claim 15, wherein commands are prioritized in the priority of commands based on a quantity of accesses to corresponding memory banks.

* * * * *